United States Patent
Ying et al.

(10) Patent No.: US 6,942,813 B2
(45) Date of Patent: *Sep. 13, 2005

(54) METHOD OF ETCHING MAGNETIC AND FERROELECTRIC MATERIALS USING A PULSED BIAS SOURCE

(75) Inventors: Chentsau Ying, Cupertino, CA (US); Padmapani C. Nallan, San Jose, CA (US); Ajay Kumar, Sunnyvale, CA (US); Xiaoyi Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 10/382,964

(22) Filed: Mar. 5, 2003

(65) Prior Publication Data

US 2004/0173570 A1 Sep. 9, 2004

(51) Int. Cl.[7] .............................. B44C 1/22; H01L 21/00
(52) U.S. Cl. .............................. 216/22; 216/63; 216/67; 134/1.1; 134/26; 438/706; 438/710
(58) Field of Search .............................. 216/22, 63, 67; 134/1.1, 26; 438/706, 710

(56) References Cited

U.S. PATENT DOCUMENTS

| | | | |
|---|---|---|---|
| 4,263,088 A | 4/1981 | Gorin | 156/626 |
| 4,357,195 A | 11/1982 | Gorin | 156/345 |
| 4,808,258 A | 2/1989 | Otsubo et al. | 156/643 |
| 4,837,185 A | 6/1989 | Yau et al. | 437/228 |
| 4,863,549 A | 9/1989 | Grunwald | 156/345 |
| 4,889,588 A | 12/1989 | Fior | 156/643 |
| 4,891,118 A | 1/1990 | Ooiwa et al. | 204/298 |
| 5,087,857 A | 2/1992 | Ahn | 315/111.21 |
| 5,160,408 A | 11/1992 | Long | 156/656 |
| 5,352,324 A | 10/1994 | Gotoh et al. | 156/643 |
| 5,362,358 A | 11/1994 | Yamagata et al. | 156/643 |
| 5,468,341 A | 11/1995 | Samukawa | 216/69 |
| 5,558,718 A | 9/1996 | Leung | 118/723 E |
| 5,614,060 A | * 3/1997 | Hanawa | 438/720 |
| 5,683,538 A | 11/1997 | O'Neill et al. | 156/345 |
| 5,705,081 A | 1/1998 | Inazawa et al. | 216/71 |
| 5,705,443 A | * 1/1998 | Stauf et al. | 438/722 |
| 5,770,097 A | 6/1998 | O'Neill et al. | 216/60 |
| 5,810,982 A | 9/1998 | Sellers | 204/298.08 |
| 5,827,435 A | 10/1998 | Samukawa | 216/69 |

(Continued)

FOREIGN PATENT DOCUMENTS

| | | | |
|---|---|---|---|
| EP | 1 071 120 | 1/2001 | ....... H01L/21/3065 |
| JP | 59047733 | 3/1984 | ......... H01L/21/302 |
| JP | 60-62125 | 4/1985 | ......... H01L/21/302 |
| JP | 61-1023 | 1/1986 | ......... H01L/21/302 |
| JP | 61-263125 | 11/1986 | ......... H01L/21/302 |

(Continued)

OTHER PUBLICATIONS

T. Maruyama et al., "Reduction of Charge Build–Up With Pulse–Modulated Bias in Pulsed Electron Cyclotron Resonance Plasma", J. Appl. Phys., vol. 37 (1998) pp 2306–2310.

*Primary Examiner*—Shamim Ahmed
(74) *Attorney, Agent, or Firm*—Moser Patterson & Sheridan LLP; Joseph Bach

(57) ABSTRACT

A method for etching magnetic and ferroelectric materials using a pulsed substrate biasing technique (PSBT) that applies a plurality of processing cycles to the substrate, where each cycle comprises a period of plasma etching without substrate bias and a period of plasma etching with the substrate bias. In exemplary applications, the method is used for fabricating magneto-resistive random access memory (MRAM) and ferroelectric random access memory (FeRAM) devices.

23 Claims, 15 Drawing Sheets

U.S. PATENT DOCUMENTS

| | | | |
|---|---|---|---|
| 6,022,460 A | 2/2000 | O et al. | 204/298.06 |
| 6,193,855 B1 | 2/2001 | Gopalraja et al. | 204/192.12 |
| 6,218,196 B1 * | 4/2001 | Ise et al. | 438/689 |
| 6,440,864 B1 * | 8/2002 | Kropewnicki et al. | 438/710 |
| 6,660,647 B1 * | 12/2003 | Ono et al. | 438/714 |
| 6,692,903 B2 * | 2/2004 | Chen et al. | 430/329 |
| 6,784,108 B1 * | 8/2004 | Donohoe et al. | 438/706 |
| 6,802,933 B2 * | 10/2004 | Khan et al. | 156/345.26 |
| 6,841,484 B2 * | 1/2005 | Ying et al. | 438/710 |

FOREIGN PATENT DOCUMENTS

| | | | |
|---|---|---|---|
| JP | 2-14523 | 1/1990 | H01L/21/302 |
| JP | 2-156529 | 6/1990 | H01L/21/302 |
| JP | 2-312229 | 12/1990 | H01L/21/302 |
| JP | 6-181185 | 6/1994 | H01L/21/302 |
| JP | 6-342769 | 12/1994 | H01L/21/302 |
| JP | 7-142453 | 6/1995 | H01L/21/3065 |

\* cited by examiner

METHOD OF ETCHING MAGNETIC AND FERROELECTRIC MATERIALS USING A PULSED BIAS SOURCE

BACKGROUND OF THE INVENTION

1. Field of the Invention

The present invention generally relates to a method for fabricating devices on semiconductor substrates. More specifically, the present invention relates to a method of etching magnetic and ferroelectric materials.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in magneto-resistive random access memories (MRAM) or ferroelectric random access memories (FeRAM).

MRAM and FeRAM comprise a plurality of memory cells that are interconnected to one another to facilitate storage of digital information. In MRAM, digital information is stored in a form of the direction of magnetization of a magnetic material, and in FeRAM the information is stored in the form of the direction of polarization of a ferroelectric material.

A memory cell in a MRAM device is a multi-layered structure comprising a pair of magnetic layers separated by a tunnel layer of a non-magnetic dielectric material (e.g., aluminum oxide ($Al_2O_3$) and the like). The magnetic layers may each comprise a plurality of films of magnetic materials, e.g., permalloy (NiFe), cobalt iron (CoFe), and the like, as well as film electrodes forming an electrical connection for the memory cell to the lines of the MRAM. In a FeRAM device, a memory cell comprises a layer of ferroelectric material, such as, e.g., lead zirconate titanate (Pb(ZrTi)$O_3$, or PZT), barium strontium titanate (Ba(SrTi)$O_3$), or BST), and the like that is supplied with film electrodes to form a capacitive structure.

Fabrication of MRAM or FeRAM devices comprises etch processes in which one or more layers comprising a device film stack are removed, either partially or in total. MRAM and FeRAM film stacks comprise the layers that are formed from materials that may be easily oxidized, sensitive to corrosion or easily damaged by plasma. During etching of these materials, the materials may leave difficult to remove conductive post-etch residues upon the film stack. Such residues may build up along the sides of the film stack. The conductive residues or eroded layers may cause electrical short-circuits within the MRAM or FeRAM device.

During etching the MRAM or FeRAM film stack, the conductive residues are repeatedly removed using wet cleaning processes that clean the wafer in solvents comprising, in various combinations, hydrogen fluoride (HF), ammonium fluoride ($NH_4F$), ammonium hydroxide ($NH_4OH$), hydrogen peroxide ($H_2O_2$), and the like. Such cleaning processes are disclosed, for example, in commonly assigned U. S. patent applications Ser. No. 10/218,244, filed Aug. 12, 2002 and Ser. No. 10/231,620 filed Aug. 29, 2002, which are incorporated herein by reference. The disadvantage of the wet cleaning processes are low efficiency and productivity of such processes, lack of real time (i.e., in situ) end point detection, as well as a need in dedicated equipment that may be incompatible with vacuumed plasma etch reactors used during fabrication of the MRAM device.

Therefore, there is a need in the art for an improved method for etching magnetic and ferroelectric materials that forms less residue on the film stacks during the etching process.

SUMMARY OF THE INVENTION

The present invention is a method for etching magnetic and ferroelectric materials using a pulsed substrate biasing technique (PSBT) that applies a plurality of processing cycles to the substrate, where each cycle comprises a period of plasma etching without substrate bias and a period of plasma etching with the substrate bias.

In exemplary applications, the method is used for fabricating magneto-resistive random access memory (MRAM) and ferroelectric random access memory (FeRAM) devices to eliminate formation of conductive residues upon film stacks of the devices and to reduce plasma-related damage.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for etching magnetic and ferroelectric materials on a semiconductor substrate. The method uses a pulsed substrate biasing technique (PSBT) that applies a plurality of processing cycles to the substrate, where each cycle comprises a period of plasma etching without substrate bias and a period of plasma etching with the substrate bias.

In exemplary applications, the method is used for fabricating magneto-resistive random access memory (MRAM) devices and ferroelectric random access memory (FeRAM) devices to eliminate formation of conductive post-etch residues upon the film stacks of the devices and to reduce plasma-related damage.

Figure 1A:
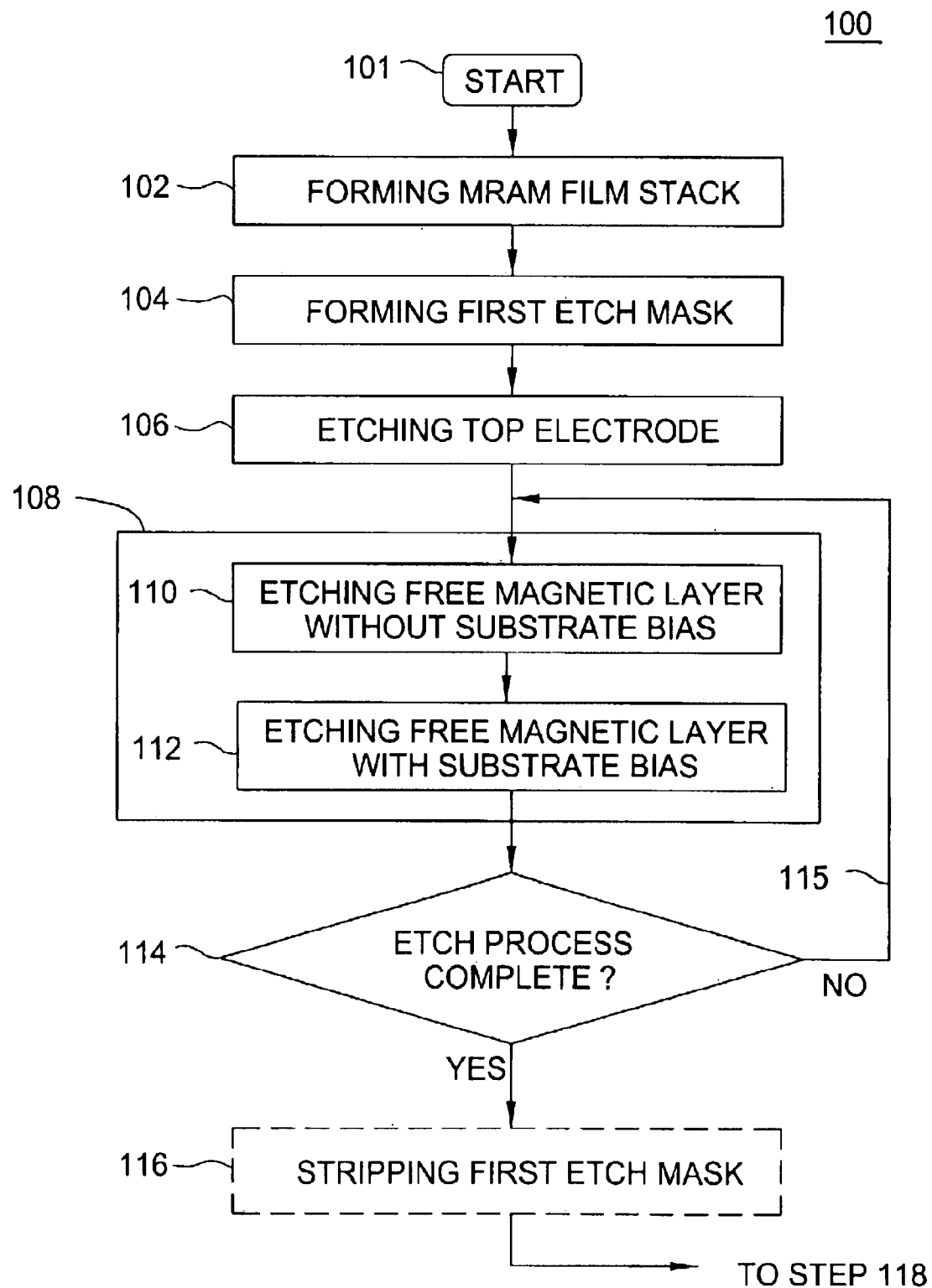
FIGS. 1A–1B depicts a flow diagram of one embodiment of a method of fabricating a MRAM film stack in accordance with the present invention.
Figure 1B:
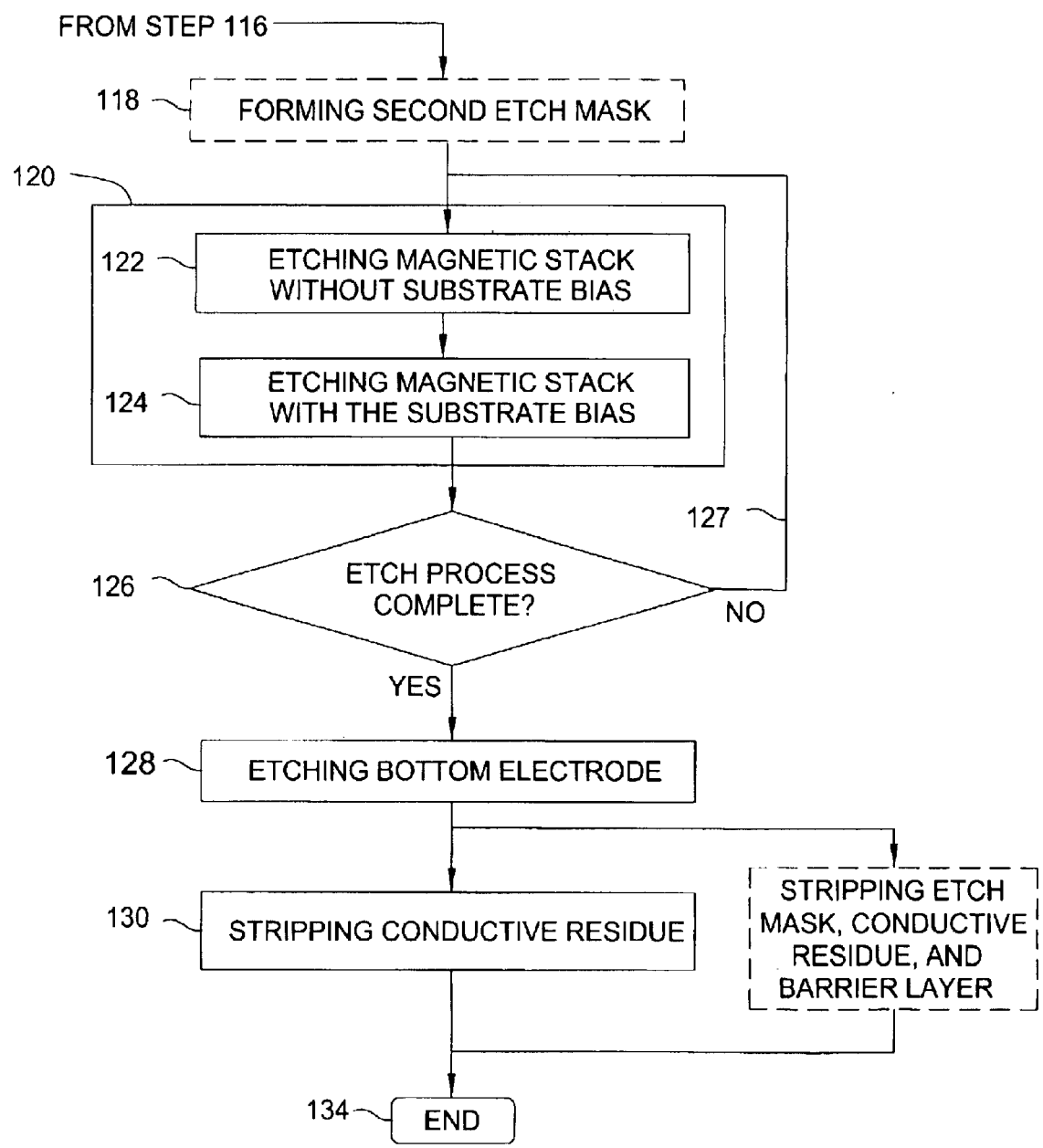

FIGS. 1A–1B depicts a flow diagram of a method 100 of fabricating a MRAM device in accordance with the present invention. The method 100 comprises processes that are performed upon a MRAM film stack during fabrication of the MRAM device.

FIGS. 2A–2L, together, depict a sequence of schematic, cross-sectional views of a substrate having a MRAM device being formed in accordance with the method 100. The views in FIGS. 2A–2L relate to individual processing steps that are used to form the MRAM device. Sub-processes, such as lithographic processes (e.g., exposure and development of photoresist, and the like) are well known in the art and, as such, are not shown in FIG. 1 and FIGS. 2A–2L. For best understanding of the invention, the reader should refer simultaneously to FIGS. 1 and 2A–2L. The images in FIGS. 2A–2L are not depicted to scale and are simplified for illustrative purposes.

Figure 2A:
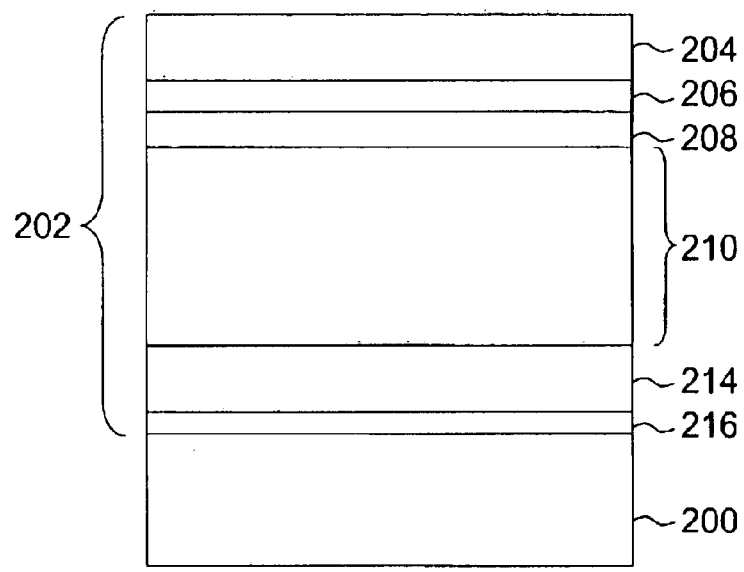
FIGS. 2A–2L together depict a sequence of schematic, cross-sectional views of a substrate having a MRAM film stack being formed in accordance with the method of FIG. 1.

The method 100 starts at step 101 and proceeds to step 102, when a MRAM film stack 202 is formed on a wafer 200 (FIG. 2A). In one embodiment, the stack 202 comprises, from top down to the wafer 200, a top electrode layer 204, a free magnetic layer 206, a tunnel layer 208, a multi-layer magnetic stack 210, a bottom electrode layer 214, and a barrier layer 216.

In one exemplary embodiment, the top electrode 204 and bottom electrode layer 214 are formed from conductors (e.g., tantalum (Ta), tantalum nitride (TaN), and the like) to a thickness of about 200–600 Angstroms. The free magnetic layer 206 generally comprises nickel and cobalt iron alloys, e.g., CoFe, NiFe, and the like. The free magnetic layer 206 may consist of one or more films of such alloys. The tunnel layer 208 may be formed, e.g., from alumina ($Al_2O_3$) or the like dielectric material to a thickness of about 10 Angstroms. The tunnel layer 208 is sandwiched between the free magnetic layer 206 and magnetic stack 210 to form a magnetic tunnel junction of the MRAM device being fabricated. The magnetic stack 210 generally comprises a plurality of magnetic layers, such as CoFe, Ru, CoFe, PtMn or IrMn, NiFe, NiFeCr, and the like, while the barrier layer 216 is formed from a dielectric material (e.g., silicon dioxide ($SiO_2$), silicon nitride ($Si_3N_4$), and the like). It should be understood, however, that the MRAM film stack 202 may comprise layers that are formed from other materials or to a different thickness.

The layers of the stack 202 may be formed using a conventional thin film deposition technique, such as an atomic layer deposition (ALD), a physical vapor deposition (PVD), chemical vapor deposition (CVD), plasma enhanced CVD, and the like.

Figure 2B:
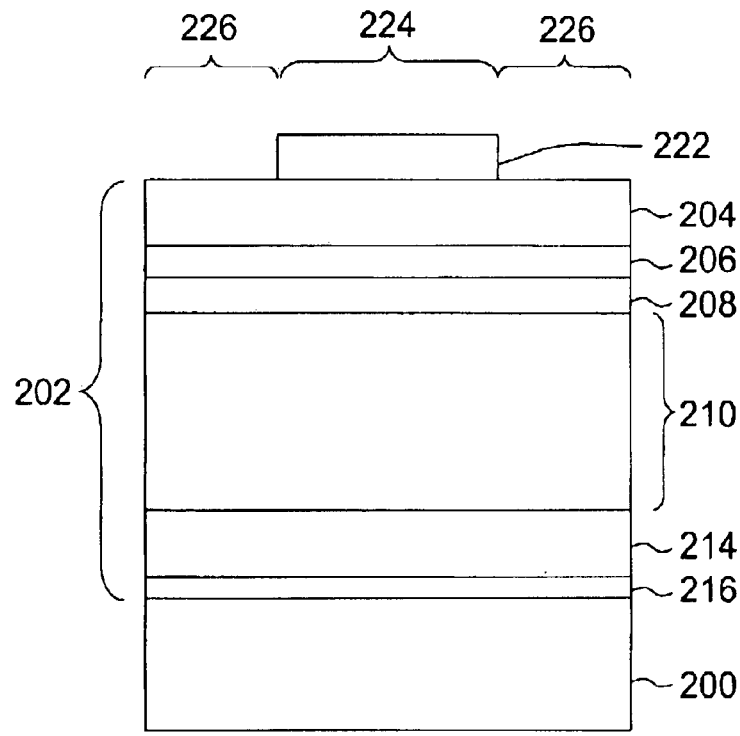

At step 104, a mask 222 is formed on the top electrode layer 204 (FIG. 2B). The mask 222 defines location and topographic dimensions of the MRAM device being fabricated using the method 100. In the depicted embodiment, the mask 222 protects the region 224 of the MRAM film stack 202 and exposes the adjacent regions 226 of the stack. The mask 222 generally is a patterned mask formed from a material that is resistant to the etchants used by the method 100, as well as stable at the temperatures used during the etch processes. The mask materials include, e.g., silicon dioxide, inorganic amorphous carbon (i.e., α-carbon), high-k dielectric materials (e.g. hafnium dioxide ($HfO_2$), $HfSiO_2$, and the like), and the like. Alternatively, the mask 222 may be formed from photoresist. Processes of applying various masks are described, e.g., in U.S. patent applications Ser. No. 10/218,244, filed Aug. 12, 2002, Ser. No. 10/231,620 filed Aug. 29, 2002, and in commonly assigned U.S. patent application Ser. No. 09/590,322, filed Jun. 8, 2000, which are incorporated herein by reference. In one illustrative embodiment, the mask 222 is formed from silicon dioxide.

Figure 2C:
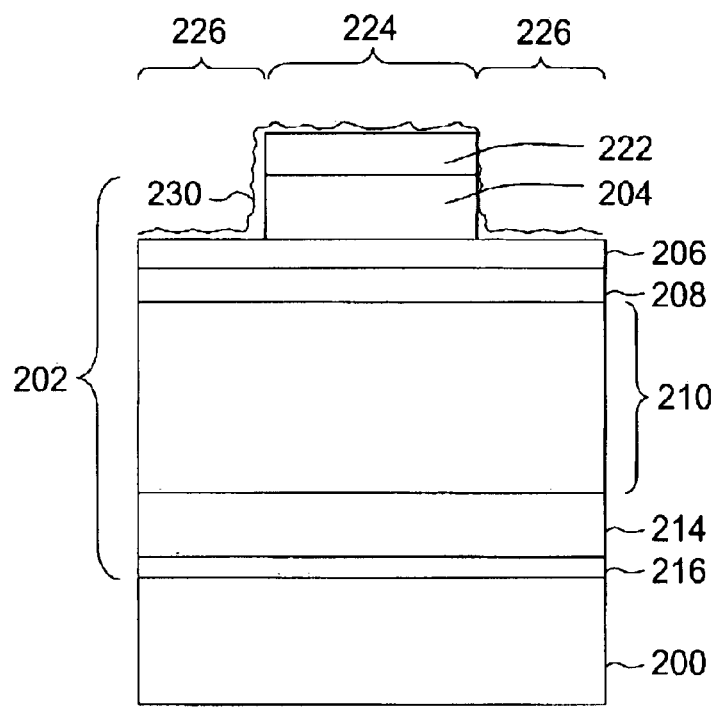

At step 106, the top electrode layer 204 is plasma etched and removed in the regions 226 (FIG. 2C). Generally, step 106 uses a fluorine-based chemistry (e.g., gas comprising carbon tetrafluoride ($CF_4$), trifluoromethane ($CHF_3$), and the like) or a chlorine-based chemistry (e.g., gas comprising chlorine ($Cl_2$), hydrogen chloride (HCl), and the like), as well as a diluent gas, such as argon (Ar). Step 106 uses the mask 222 (e.g., $SiO_2$ mask) as an etch mask and may use the free magnetic layer 206 as an etch stop layer (e.g., an endpoint detection system of the etch reactor may monitor plasma emissions at a particular wavelength to determine that the top electrode layer 204 has been removed in the regions 226).

Step 106 can be performed, e.g., in a Decoupled Plasma Source (DPS) of the CENTURA® system available from Applied Materials, Inc. of Santa Clara, Calif. The DPS reactor (described in reference to FIG. 4 below) uses an inductive source to produce a high-density plasma and a source of radio-frequency (RF) power to bias the wafer.

In one illustrative embodiment, during etching the top electrode layer 204 in the DPS reactor, step 106 provides carbon tetrafluoride at a rate of 40 to 80 sccm and trifluoromethane at a rate of 10 to 30 sccm (i.e., a $CF_4$:$CHF_3$ flow ratio ranging from 4:3 to 8:1), as well as argon at a rate of 40 to 80 sccm, applies 200 to 3000 W of plasma power and 0 to 300 W of bias power, and maintains a wafer temperature at 0 to 250 degrees Celsius and a pressure in the reaction chamber at 5 to 40 m torr. One exemplary process provides $CF_4$ at a rate of 60 sccm, $CHF_3$ at a rate of 20 sccm (i.e., a $CF_4$:$CHF_3$ flow ratio of about 3:1), Ar at a rate of 60 sccm, 1000 W of plasma power, 50 W of bias power, a wafer temperature of 80 degrees Celsius, and a pressure of 10 m Torr.

Step 106 develops metal-containing (e.g., comprising tantalum) conductive residue 230 that, however, may stay until the next step (step 108) of the method 100.

Figure 2D:
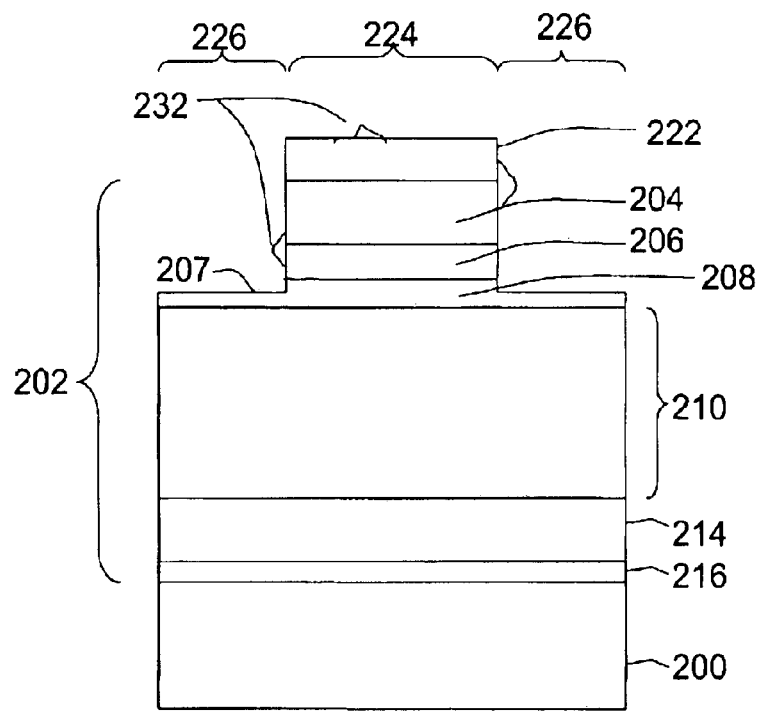
Figure 2E:
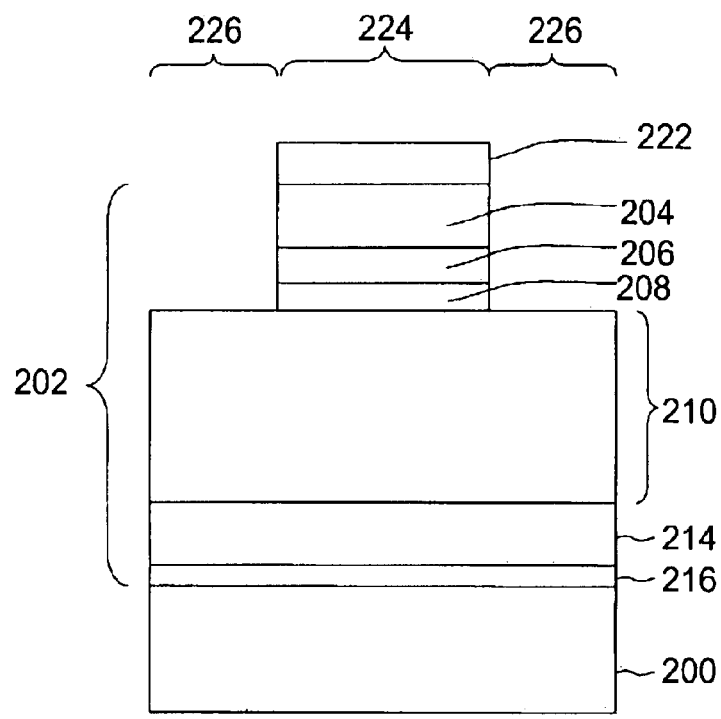
Figure 2F:
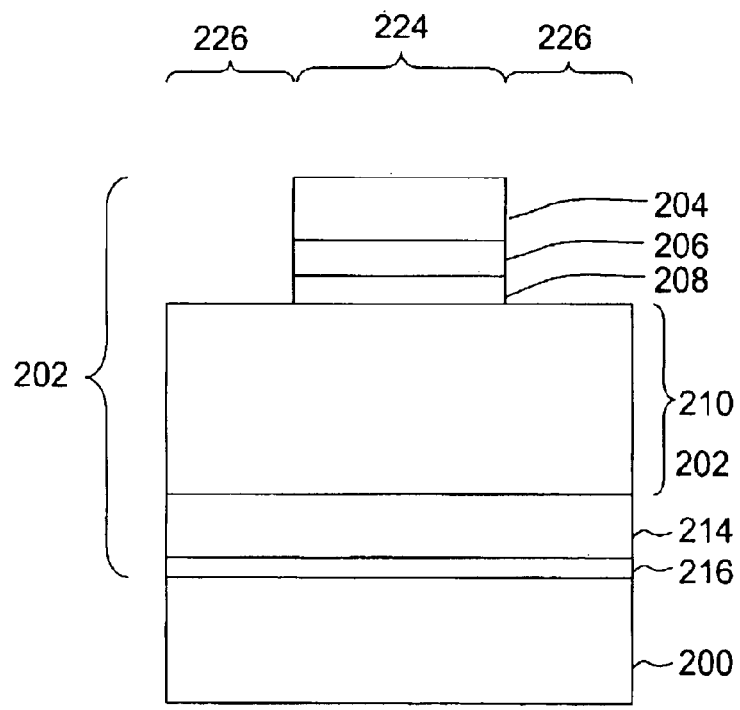

At step 108, the free magnetic layer 206 is plasma etched and removed in the regions 226 (FIGS. 2D and 2E). Step 108 uses a pulsed substrate biasing technique (PSBT). The PSBT process is an etch process that comprises a period 110 of plasma etching with no substrate bias and a period 112 of plasma etching with a bias applied to the wafer 200, e.g., RF bias. A cycle comprising the periods 110 and 112 may be repeated until the free magnetic layer 206 is removed in the regions 226 (discussed in reference to step 114 below). FIG. 2D depicts the wafer 200 after an intermediate cycle of the PSBT process of step 108, while FIG. 2E depicts the wafer upon completion of the process. In one embodiment, step 108 uses an etchant gas comprising oxygen and chlorine. Such etch process is disclosed in U.S. patent application Ser. No. 10/218,244, filed Aug. 12, 2002. Step 108 may also use the tunnel layer 208 as an etch stop layer.

In one embodiment, during the periods 110 and 112, the PSBT process energizes the etchant gas to a plasma at a frequency of about 0.35 to 13.6 MHz using, for example, an inductively coupled antenna. Further, during the period 112, the PSBT process biases the wafer, e.g., at a frequency of about 0.35 to 13.6 MHz. A duration of each of the periods 110 and 112 is between about 0.2 and 8 msec, while a total duration of one cycle of the PSBT process is about 1.0 to 10 msec. A duty cycle ratio of the period of etching with the substrate bias (i.e., period 112) within each processing cycle ranges from about 20 to 80%. During one exemplary PSBT process, the period 110 has a duration of 1 msec and the period 112 has a duration of 1 msec, which corresponds to a duty cycle of about 50%. The PSBT process may comprise a plurality of such processing cycles where each cycle comprises a period of plasma etching with no substrate bias (period 110) and a period of plasma etching with the substrate bias (period 112).

During the period 110, a surface 207 of the free magnetic layer 206 is exposed to the etchant gas that is energized to form a plasma. The period 110 performs plasma enhanced chemical etching of the free magnetic layer 206, while the period 110 does not physically etch (i.e., sputter) the layer. The plasma during this period transforms an upper portion of the free magnetic layer 206, as well as the residue 230, into volatile compounds that are then evacuated from a processing chamber and the surface 207 also absorbs reactive species from the etchant gas. The absorbed reactive species enhance etching of the free magnetic layer 206 during the following period 112. The process during this period 110 may also deposit non-volatile by-products of the etch process on the surface 207 and elsewhere on the wafer 200. Such by-products should be removed before the etch rate reduces or the etch process self-terminates.

During the period 112, the surface 207 of the layer 208 is exposed to the etchant gas energized to form a plasma. In the exemplary embodiment, using the DPS reactor, the plasma is produced by the inductively coupled power source in conjunction with the source of RF bias power that is coupled to a substrate support pedestal. The plasma performs simultaneous plasma enhanced chemical etching and physical etching (i.e., sputtering) of the free magnetic layer 206, as well as removal of the non-volatile by-products that remain after the period 110. The PSBT process applies lower average bias power than a conventional etch process and, as such, the PSBT process reduces plasma charge-up damage to the MRAM film stack 202, specifically, to the dielectric tunnel layer 208 and barrier layer 216.

Similar to a conventional etch process, during the period 112, the metals (e.g., Co, Fe, Ni, and the like) containing in the free magnetic layer 206 combine with components of the etchant gas and by-products of the etch process to form conductive residue. Such residue may combine with the residue 230 (i.e., residue remaining after step 106) to form a residue 232. However, using the method 100, formation of such residue is substantially reduced or entirely eliminated because of increased chemical activity of the etchant gas. The period 110 provides for reactive species of the etchant gas the residence time sufficient to volatilize the otherwise non-volatile compounds on the surfaces of the MRAM film stack 202, as well as be absorbed by these surfaces. Then, the period 112 physically activates the absorbed reactive species and, as such, increases the effectiveness of etching the magnetic materials (layer 206), as well as the effectiveness of removing the conductive residue (residue 232). In the aggregate, step 108 does not leave conductive residue on the MRAM film stack 202 or the wafer 200 upon completion of the PSBT process that should be removed before the method 100 may proceed to the next step (step 116).

Similar to step 106, step 108 can be performed in the DPS reactor. In one embodiment, the period 110 provides oxygen ($O_2$) at a rate of 10 to 50 sccm and chlorine ($Cl_2$) at a rate of 10 to 100 sccm (corresponds to a $O_2$:$Cl_2$ flow ratio ranging from 1:10 to 5:1), as well as argon at a rate of 10 to 100 sccm, applies 200 to 3000 W of plasma power and no bias power, and maintains a wafer temperature at 15 to 80 degrees Celsius and a pressure in the reaction chamber at 1 to 20 m Torr. One exemplary process provides $O_2$ at a rate of 40 sccm, $Cl_2$ at a rate of 20 sccm (i.e., a $O_2$:$Cl_2$ flow ratio of about 2:1), Ar at a rate of 20 sccm, 700 W of plasma power, 0 W of bias power, a wafer temperature of 40 degrees Celsius, and a pressure of 5 m Torr. The period 112 uses the same process recipe as the period 110 and, additionally, applies the RF bias power of about 0 to 500 W at a frequency of about 13.56 MHz, while one exemplary process applies 100 W.

At step 114, the method 100 queries whether the free magnetic layer 206 has been removed in the regions 226. In a computerized etch reactor, such as the exemplary DPS reactor, at step 114, the decision making routine may be automated using, e.g., an end-point detection technique. For example, the endpoint detection system of the reactor may monitor plasma emissions at a particular wavelength to determine an end of the etch process.

If the query of step 114 is negatively answered, the method 100 proceeds to step 108 to continue the PSBT process, as illustratively shown using a link 115. As such, the PSBT process may sequentially perform a plurality of processing cycles, where each cycle comprises a period of plasma enhanced chemical etching the free magnetic layer 206 (period 110) and a period of simultaneous plasma enhanced chemical etching and physical etching the layer 206 (period 112). If the query of step 114 is affirmatively answered, the method 100 proceeds to step 116.

Figure 2G:
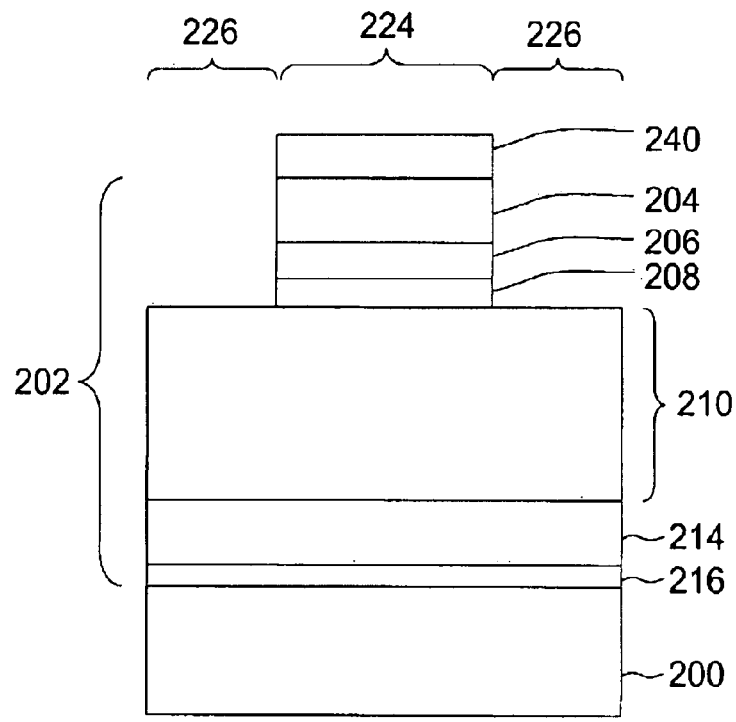

At step 116, the mask 222 is stripped (FIG. 2F) and, at step 118, a second mask 240 is formed on the MRAM film stack 202 (FIG. 2G). Generally, the mask 240 is used when the mask 222 is excessively consumed or contaminated during step 108 or the magnetic stack 210, after etched, should have topographic dimensions that are greater then that of the mask 222. As such, steps 116 and 118 may be considered optional. The processes used to strip the mask 222 are described, e.g., in U.S. patent applications Ser. No. 10/218,244, filed Aug. 12, 2002. To apply the second mask 240, step 118 may use the processes discussed above in reference to step 104. In the depicted embodiment, the masks 222 and 240 have the same dimensions.

Figure 2H:
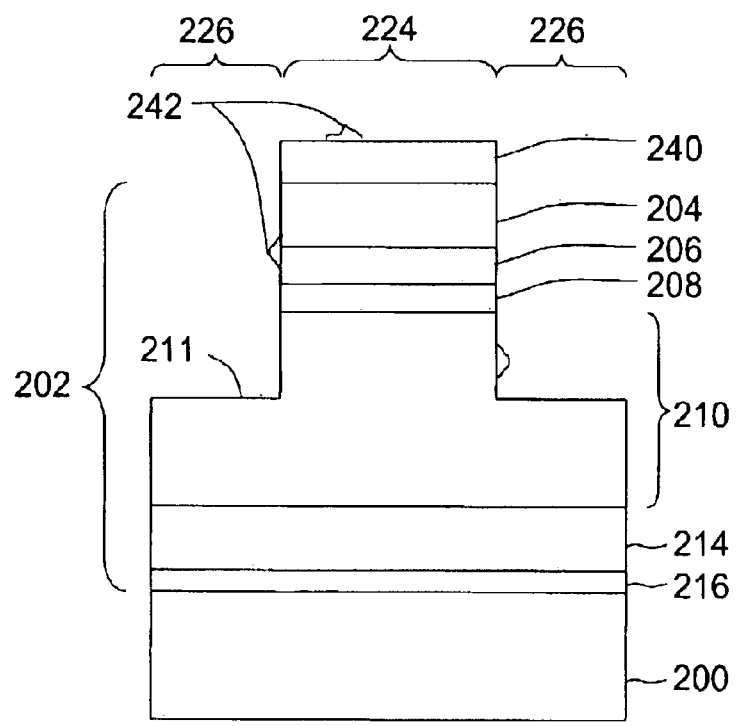
Figure 2I:
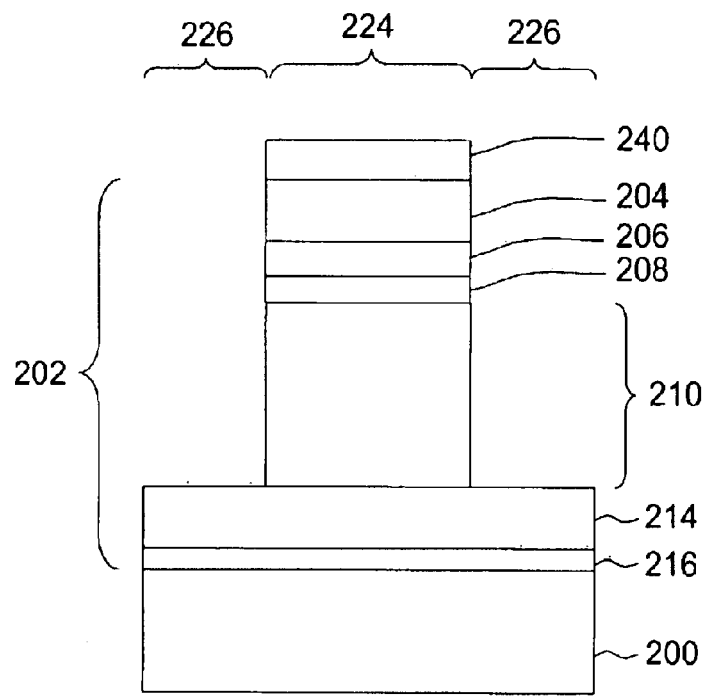
Figure 2J:
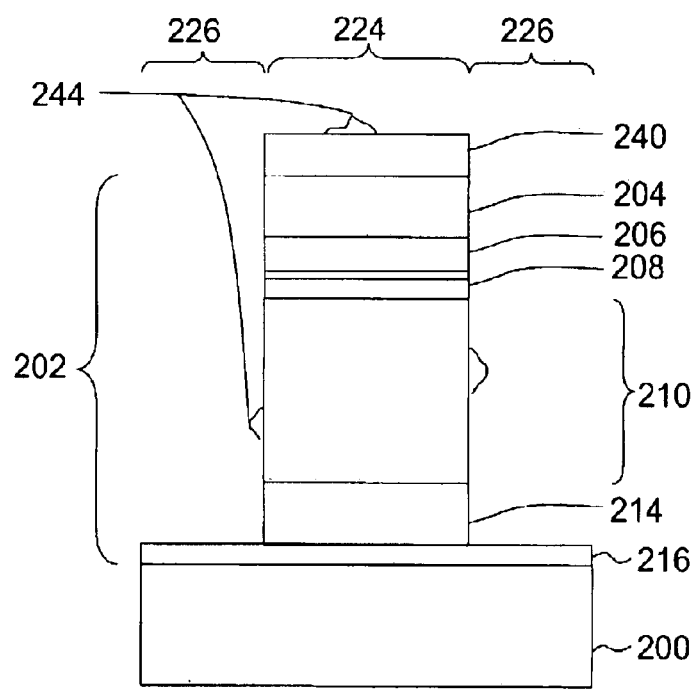

At step 120, the PSBT process etches and removes the magnetic film stack 210 in the regions 226 using, e.g., a boron trichloride ($BCl_3$) based chemistry (FIG. 2H and 2I). Contemporaneously with etching the magnetic film stack 210, step 120 also removes a thin tunnel layer 208. Step 114 may use the bottom electrode layer 214 as an etch stop layer. Similar to step 108, step 120 comprises a period of plasma etching with no substrate bias (period 122), as well as a period of plasma etching with the substrate bias (period 124). A cycle comprising the periods 122 and 124 may be repeated until the magnetic film stack 210 is entirely removed in the regions 226 (discussed in reference to step 126 below). FIG. 2H depicts the wafer 200 after an intermediate cycle of the PSBT process of step 120, while FIG. 2I depicts the wafer upon completion of the process.

During the period 122, a surface 211 the magnetic film stack 210 is exposed to an etchant gas energized to form a first plasma that performs plasma enhanced chemical etching process. Then, during the period 124, the surface 211 is exposed to such plasma in conjunction with the substrate bias, e.g., RF bias. The PSBT process of step 120, similar to the PSBT process of step 108, increases chemical activity of the etching chemistry used to etch the magnetic materials (magnetic film stack 210), as well as increases effectiveness of removing conductive residues (residue 242) that are produced during the etch process. As such, upon completion of the PSBT process (i.e., when the magnetic film stack 210 is removed in the regions 226), the residue 242 is also removed from the wafer 200 and, as such, the method 100 may proceed to the next step (step 128).

Step 120 can be performed, e.g., in the DPS reactor. In one illustrative embodiment, the period 122 provides boron trichloride at a rate of 5 to 20 sccm and argon at a rate of 20 to 80 sccm (i.e., a $BCl_3$:Ar flow ratio ranging from 1:40 to 1:1), applies 200 to 3000 W of plasma power and no bias power, and maintains a wafer temperature at 15 to 80 degrees Celsius and a pressure in the reaction chamber at 5 to 20 m Torr. One exemplary process provides $BCl_3$ at a rate of 20 sccm, Ar at a rate of 80 sccm (i.e., a $BCl_3$:Ar flow ratio of about 1:4), 700 W of plasma power, 0 W of bias power, a wafer temperature of 80 degrees Celsius, and a pressure of 5 m Torr. The period 124 uses the same process recipe as the period 122 and, additionally, applies the RF bias power of about 0 to 500 W, while one exemplary process applies 100 W.

At step 126, the method 100 queries whether the magnetic film stack 210 has been removed in the regions 226. If the query of step 126 is negatively answered, the method 100 proceeds to step 120 to continue the PSBT process, as illustratively shown using a link 127. If the query of step 114 is affirmatively answered, the method 100 proceeds to step 116.

At step 128, the bottom electrode layer 214 is plasma etched and removed in the regions 226 using, e.g., a chlorine-based chemistry (FIG. 2H). Step 114 may use the barrier layer 216 (e.g., $SiO_2$, silicon nitride ($Si_3N_4$), and the like) as an etch stop layer.

Step 128 can be performed, e.g., in the DPS reactor. In one illustrative embodiment, step 116 provides chlorine at a rate of 10 to 100 sccm and argon at a rate of 10 to 100 sccm (i.e., a $Cl_2$:Ar flow ratio ranging from 1:10 to 10:1), applies 200 to 3000 W of plasma power and 0 to 300 W of bias power, and maintains a wafer temperature at 15 to 80 degrees Celsius and a pressure in the reaction chamber at 5 to 40 mTorr. One exemplary etch process provides $Cl_2$ at a rate of 45 sccm, Ar at a rate of 45 sccm (i.e., a $Cl_2$:Ar flow ratio of about 1:1), 700 W of plasma power, 75 W of bias power, a wafer temperature of 80 degrees Celsius, and a pressure of 10 mTorr.

Step 128 develops a metal-containing (e.g., comprising tantalum) conductive residue 244. The residue 244 may short-circuit the free magnetic layer 206 and magnetic film stack 210. As such, the residue 244 should be removed prior to completion of the process 100.

Figure 2K:
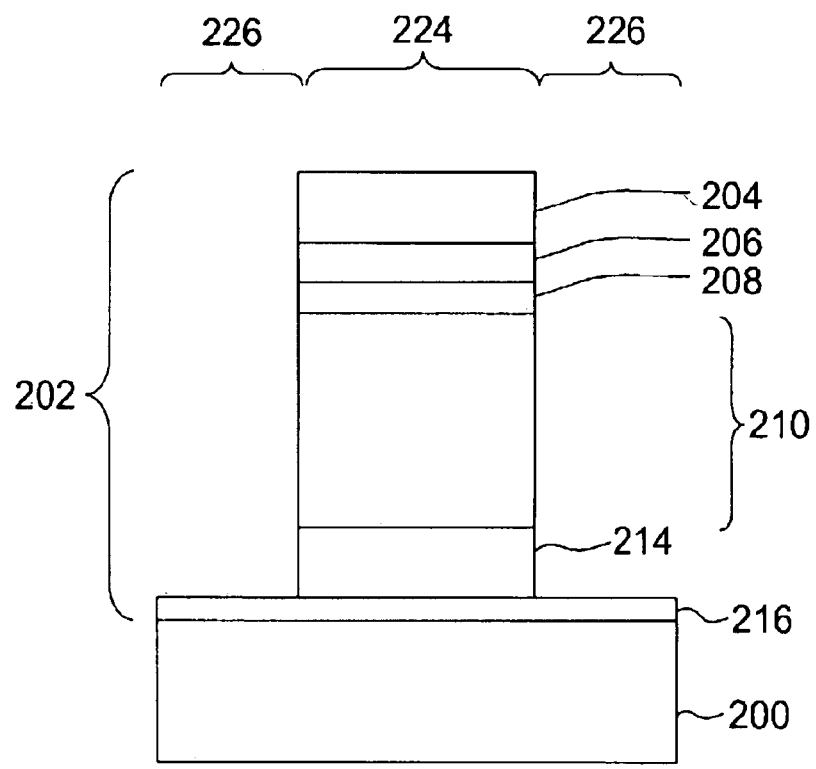
Figure 2L:
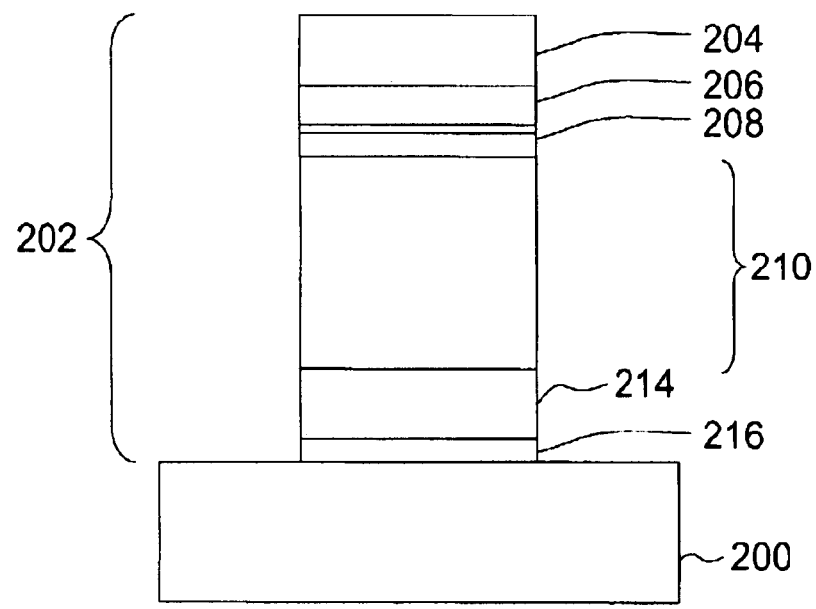

At step 130, the conductive residue 244 is stripped using, e.g., a $NH_4OH/H_2O_2/H_2O$ solvent followed by a rinse in distilled water (FIG. 2K). Step 130 deliberately does not remove the mask 240 and the barrier layer 216 which generally may be further used during an integration of the being fabricated MRAM device into a MRAM memory cell structure. In an alternative embodiment, at step 132, the mask 240, residue 244, and the exposed portion (i.e., regions 226) of the barrier layer 216 may be removed using a buffered oxide etch (BOE) process followed by a rinse in distilled water (FIG. 2L). The processes of the steps 130 and 132 are described in U.S. patent applications Ser. No. 10/218,244, filed Aug. 12, 2002 and can be performed using, e.g., a single substrate wet cleaning module available from Applied Materials, Inc. of Santa Clara, Calif. Such module is described in U.S. patent application Ser. No. 09/945,454, filed Aug. 31, 2001, which is herein incorporated by reference. At step 134, the method 100 ends.

Figure 4:
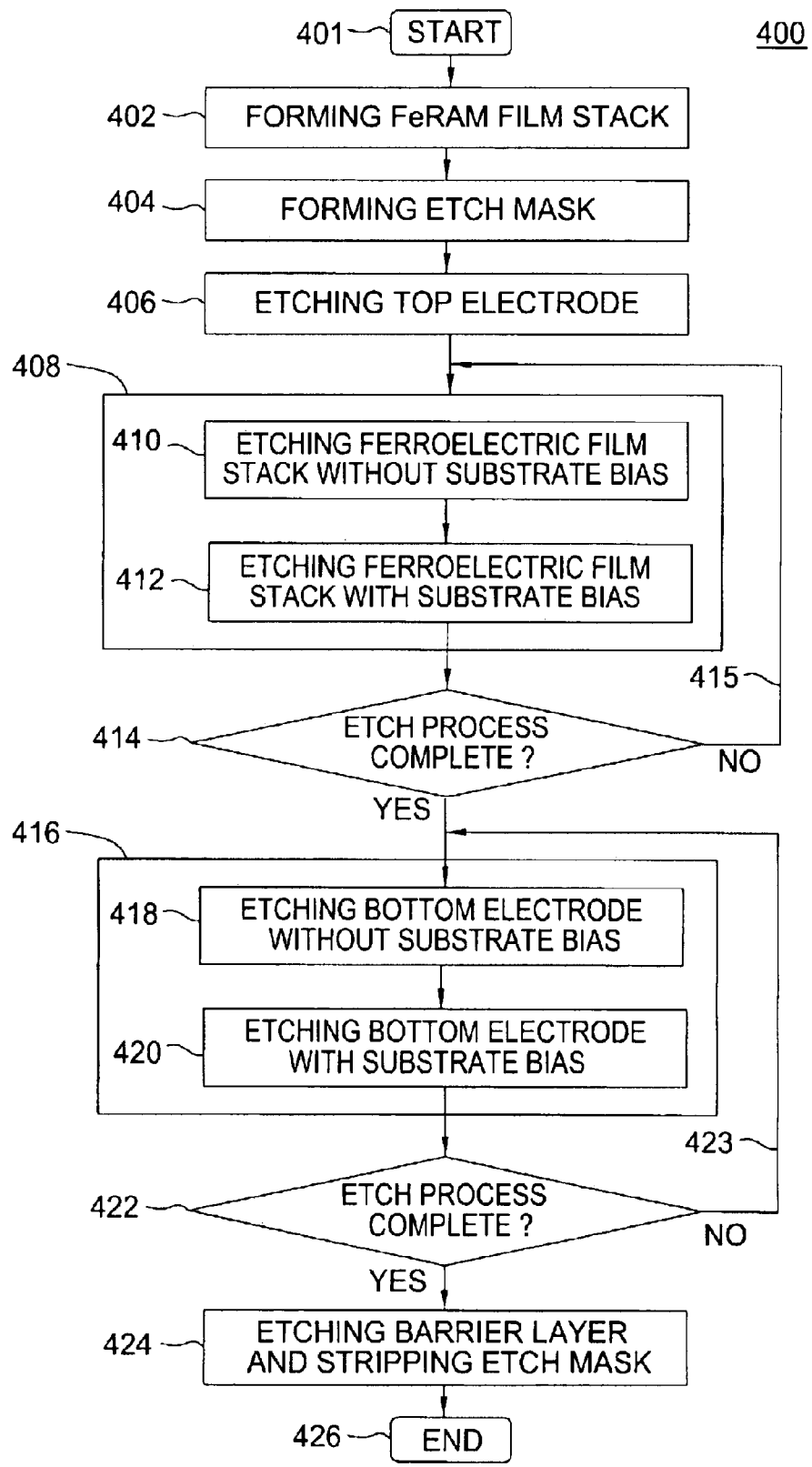
FIG. 4 depicts a flow diagram of one embodiment of a method of fabricating a FeRAM film stack in accordance with the present invention.

In another application, the inventive method is used during fabrication of the FeRAM device. FIG. 4 depicts a flow diagram of a method 400 of fabricating a FeRAM device in accordance with the present invention. FIGS. 5A–5G, together, depict a sequence of schematic, cross-sectional views of a substrate having a FeRAM device being formed in accordance with the method 400. The views in FIGS. 5A–5G relate to individual processing steps that are used to form the FeRAM device. Sub-processes, such as lithographic processes, are not shown in FIG. 4 and FIGS. 5A–5G. The images in FIGS. 5A–5G are not depicted to scale and are simplified for illustrative purposes, and the reader is suggested to refer simultaneously to FIGS. 4 and 5A–5G.

Figure 5A:
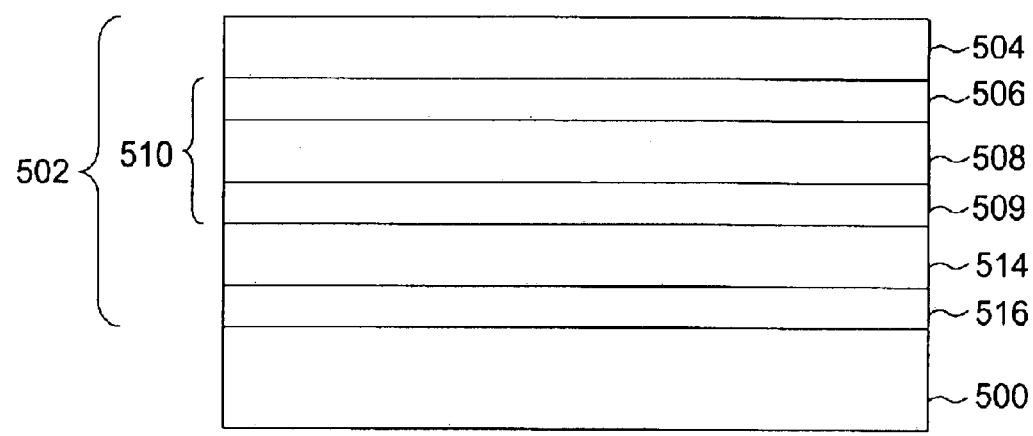
FIGS. 5A–5G together depict a sequence of schematic, cross-sectional views of a substrate having a FeRAM film stack being formed in accordance with the method of FIG. 3.

The method 400 starts at step 401 and proceeds to step 402, when a FeRAM film stack 502 is formed on a wafer 500, e.g., a silicon wafer (FIG. 5A). In one embodiment, the stack 502 comprises, from top down to the wafer 500, a top electrode layer 504, a ferroelectric film stack 510, a bottom electrode layer 514, and a barrier layer 516.

The top electrode layer 504 and bottom electrode layer 514 generally are formed from high temperature conductors, such as iridium (Ir), platinum (Pt), ruthenium (Ru), and the like. The ferroelectric layer 508 is sandwiched by a first insulating film 506 and second insulating film 509. The films 506 and 509 (e.g., iridium oxide ($IrO_2$) films) are used to reduce diffusion of contaminants (e.g., oxygen) from the layer 508 into the electrode layers 504 and 514, however, films 506 and 509 are considered optional. The ferroelectric layer 508 typically is formed from a dielectric material having a perovskite-type structure, such as lead zirconate titanate ($Pb(ZrTi)O_3$, or PZT), barium strontium titanate ($Ba(SrTi)O_3$), or BST), and the like. In one exemplary embodiment, the ferroelectric layer 508 is formed from PZT. The barrier layer 516 generally is a dielectric layer (e.g., layer of silicon dioxide ($SiO_2$), silicon nitride ($Si_3N_4$), and the like) that may comprise an upper film of titanium nitride (TiN), TiAlN,.and the like. In other embodiments, the FeRAM film stack 502 may comprise layers formed from other materials or to a different thickness.

The layers of the FeRAM film stack 502 may be formed using a conventional thin film deposition technique, such an ALD, PVD, CVD, plasma enhanced CVD, and the like.

Figure 5B:
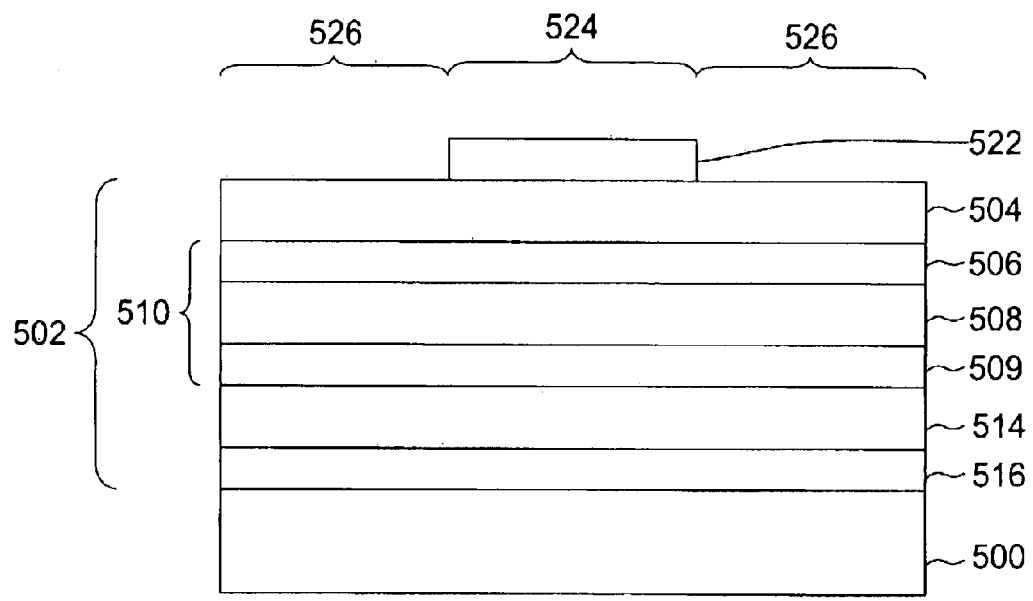

At step 404, a mask 522 is formed on the top electrode layer 504 (FIG. 5B). The mask 522 defines location and topographic dimensions of the FeRAM device being fabricated using the method 400. In the depicted embodiment, the mask 522 protects the region 524 of the FeRAM film stack 502 and exposes the adjacent regions 526 of the film stack. The mask 222 generally is a patterned mask formed from a material that is resistant to the etchants used by the method 400, as well as stable at the temperatures used during the etch processes. The mask 522 may be formed using the materials and processed discussed above in reference to the masks 222 and 240. In one illustrative embodiment, the mask 522 is formed from silicon dioxide.

Figure 5C:
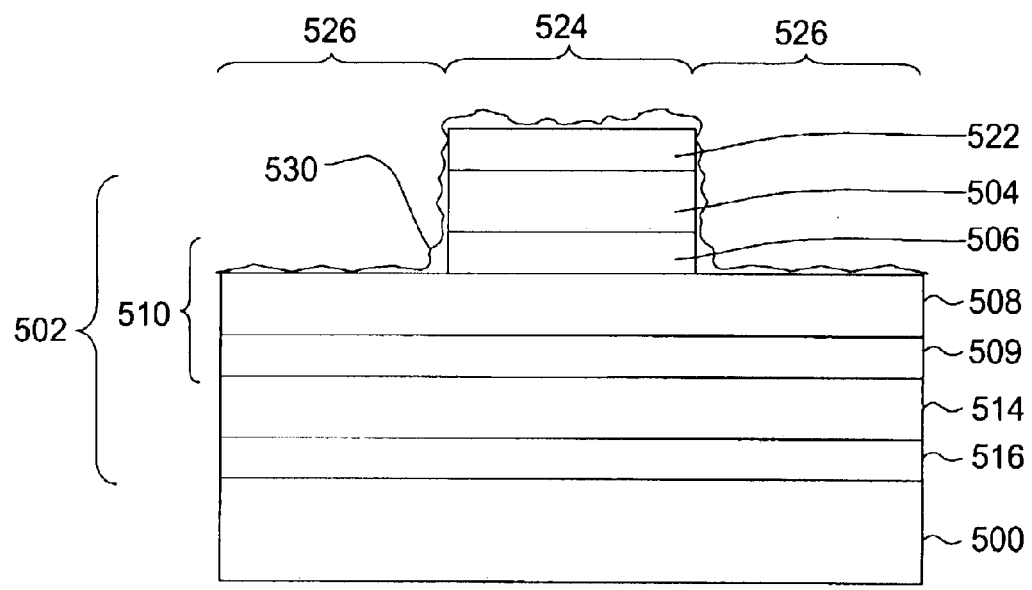

At step 406, the top electrode layer 504 is plasma etched and removed in the regions 526 (FIG. 5C). In one embodiment, step 406 uses a gas comprising chlorine, trifluoromethane ($CHF_3$), oxygen, and a diluent gas, such as argon. Such process is described in commonly assigned U.S. patent application Ser. No. 10/210,550, filed Jul. 31, 2002, which is incorporated herein by reference. Step 106 uses the mask 522 (e.g., $SiO_2$ mask) as an etch mask and may use the first insulating film 506 as an etch stop layer.

Step 406 can be performed, e.g., in the DPS reactor. In one illustrative embodiment, step 406 provides chlorine at a rate of 1 to 100 sccm, trifluoromethane at a rate of 0 to 20 sccm, and oxygen at a rate of 5 to 100 sccm (i.e., a $Cl_2$:$CHF_3$:$O_2$ flow ratio ranging from 1:0:1 to 20:1:1), as well as argon at a rate of 0 to 20 sccm, applies 200 to 3000 W of plasma power and 50 to 300 W of bias power, and maintains a wafer temperature at 15 to 500 degrees Celsius and a pressure in the reaction chamber at 5 to 50 mTorr. One exemplary process provides 100 sccm of $Cl_2$, 0 sccm of $CHF_3$, 50 sccm of $O_2$ (i.e., a $Cl_2$:$CHF_3$:$O_2$ flow ratio of about 2:0:1), 0 sccm of Ar, 1000 W of plasma power, 300 W of bias power, a wafer temperature of 350 degrees Celsius, and a pressure of 10 mTorr.

Step 406 develops metal-containing (e.g., comprising tantalum) conductive residue 530 that, however, may stay until the next step (step 508) of the method 400.

Figure 5D:
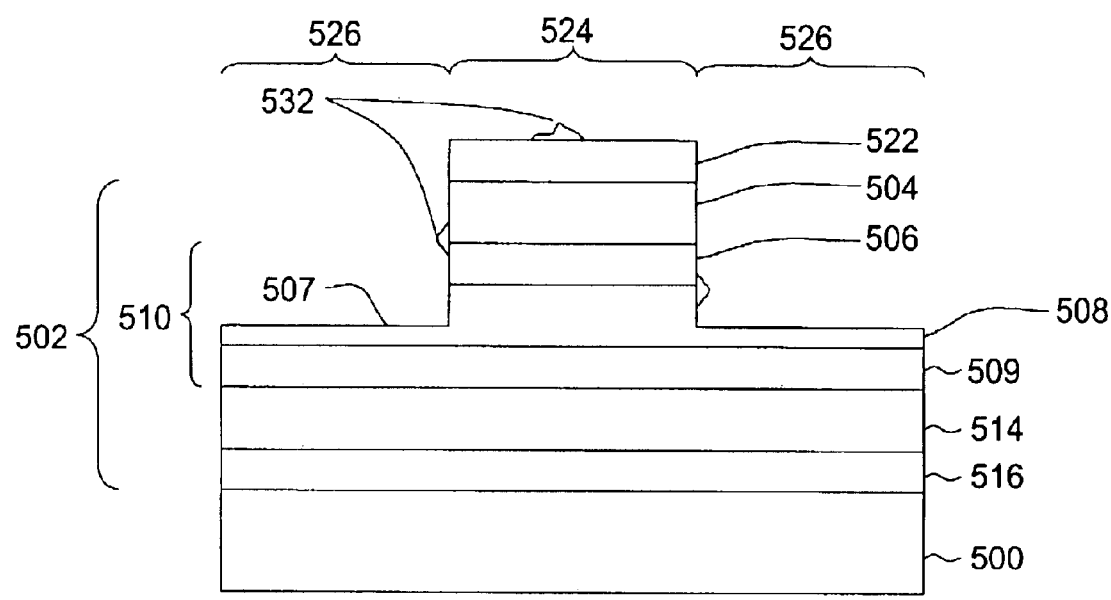
Figure 5E:
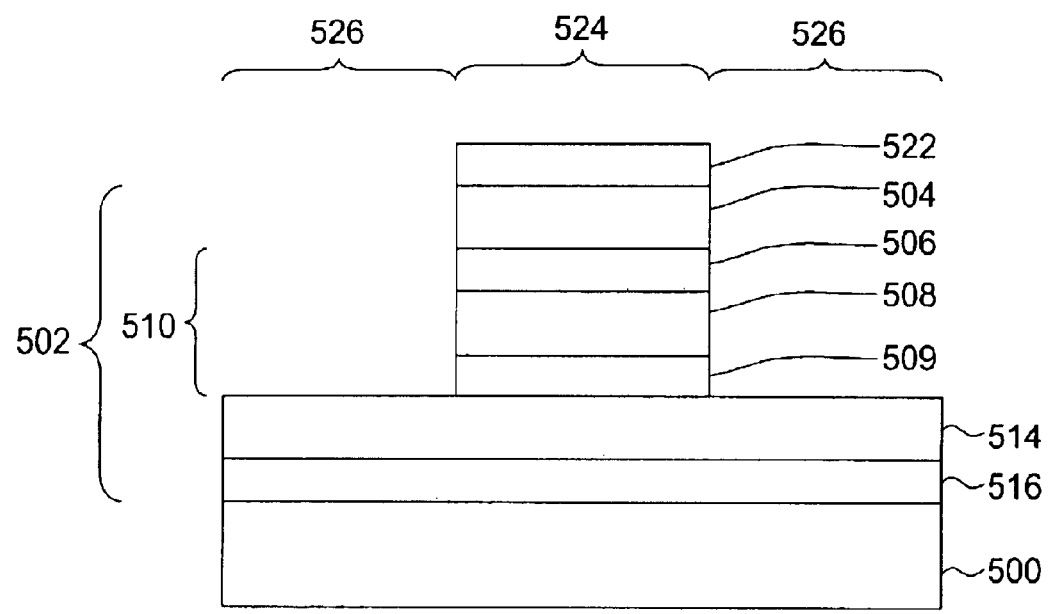

At step 408, the PSBT process etches and removes the ferroelectric film stack 510 in the regions 526 using, e.g., an etchant gas comprising boron trichloride ($BCl_3$), trifluoromethane ($CHF_3$), and a diluent gas, such as argon (FIGS. 5D and 5E). Such etching chemistry is described U.S. patent application Ser. No. 10/210,550, filed Jul. 31, 2002. Step 408 may use the bottom electrode layer 514 as an etch stop layer.

Similar to the PSBT processes of steps 108 and 120 discussed above in reference to the method 100, the PSBT process of step 408 comprises a period of plasma etching with no substrate bias (period 410), as well as a period of plasma etching with the substrate bias (period 412). Correspondingly, a cycle comprising the periods 410 and 412 may be repeated until the ferroelectric film stack 510 is removed in the regions 526 (discussed in reference to step 414 below). FIG. 5D depicts the wafer 500 after an intermediate cycle of the PSBT process, while FIG. 5E depicts the wafer upon completion of the process. Alternatively, separate etch processes may be used to remove the insulating films 506 and 509, e.g., the process described above in reference to step 406.

During the period 410, a surface 511 the ferroelectric film stack 510 is exposed to the etchant gas energized to form a first plasma that performs plasma enhanced chemical etching process. Then, during the period 412, the surface 511 is exposed to such plasma in conjunction with the substrate bias, e.g., RF bias. Such PSBT process increases chemical activity of etching the ferroelectric materials (layer 506), removes combined conductive residue (residue 532), as well as reduces the plasma charge-up damage to the dielectric layers of the FeRAM film stack 502 (i.e., layers 506, 508, 509, and 516). Upon completion of the PSBT process (i.e., when the ferroelectric film stack 510 is removed in the regions 526), post-etch residue is also simultaneously removed from the wafer 500 and, as such, the method 400 may proceed to the next step (step 416).

Step 408 can be performed, e.g., in the DPS reactor. In one illustrative embodiment, the period 410 provides boron trichloride at a rate of 10 to 50 sccm and trifluoromethane at a rate of 0 to 20 sccm (i.e., a $BCl_3$:$CHF_3$ flow ratio ranging from 1:0 to 10:1), as and well as argon at a rate of 10 to 100 sccm, applies 200 to 3000 W of plasma power and no bias power, and maintains a wafer temperature at 15 to 500 degrees Celsius and a pressure in the reaction chamber at 5 to 50 mTorr. One exemplary process provides 40 sccm of $BCl_3$, 5 sccm of $CHF_3$, (i.e., a $BCl_3$:$CHF_3$ flow ratio of about 4:1), 90 sccm of Ar, 1500 W of plasma power, 150 W of bias power, a wafer temperature of 310 degrees Celsius, and a pressure of 15 mTorr.

The period 412 uses the same process recipe as the period 410 and, additionally, applies the RF bias power of about 50 to 500 W at a frequency of about 13.56 MHz, while one exemplary process applies 300 W.

Similar to the PSBT processes described above, the period 410 and period 412 have a duration of about 0.2 to 8 msec, and a total duration of one cycle of the process is about 1.0 to 10 msec. A duty cycle ratio of the period 412 within each cycle ranges from about 20 to 80%. One exemplary PSBT process comprised the periods 410 and 412 each having a duration of 1 msec.

At step 414, the method 400 queries whether the ferroelectric film stack 510 has been removed in the regions 526. If the query of step 414 is negatively answered, the method 400 proceeds to step 408 to continue the PSBT process, as illustratively shown using a link 415. If the query of step 414 is affirmatively answered, the method 400 proceeds to step 416.

Figure 5F:
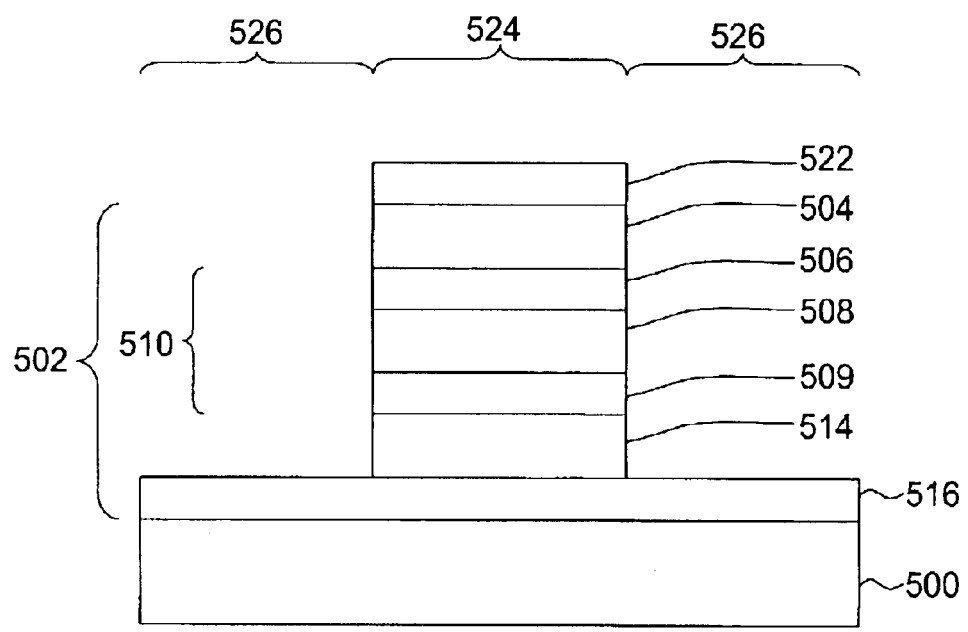

At step 416, the bottom electrode layer 514 is plasma etched and removed in the regions 526 (FIG. 5F). Step 416 may use the barrier layer 516 (e.g., $SiO_2$, silicon nitride ($Si_3N_4$), and the like) as an etch stop layer. Step 416 uses the etching chemistry described above in reference to step 408 to perform the PSBT process. Similar to step 408, the PSBT process comprises a period of plasma etching with no substrate bias (period 418) and a period of plasma etching with the substrate bias (period 420). A cycle comprising the periods 418 and 420 is repeated until the bottom electrode layer 514 is removed in the regions 526. The PSBT process increases chemical activity of the etchant and reduces residue formations, as well as reduces plasma damage to the dielectric layers of the FeRAM film stack 502.

During the period 418, the PSBT process generally provides the process recipe of step 406 at no substrate bias (i.e., 0 W of bias power). Correspondingly, during the period 420, the PSBT process additionally provides the substrate bias of about 50 to 300 W. A duration and duty cycle of the periods 418 and 420 are typically within the ranges described above in reference to step 408.

At step 422, the method 400 queries whether the bottom electrode layer 514 has been removed in the regions 526. If the query of step 422 is negatively answered, the method 400 proceeds to step 416 to continue etching, as illustratively shown using a link 423. If the query of step 422 is affirmatively answered, the method 400 proceeds to step 424.

Upon completion of the PSBT process (i.e., when the bottom electrode layer 514 is removed in the regions 526), post-etch residue is also simultaneously removed from the wafer 500 and, as such, the method 400 may proceed to the next step (step 424).

Figure 5G:
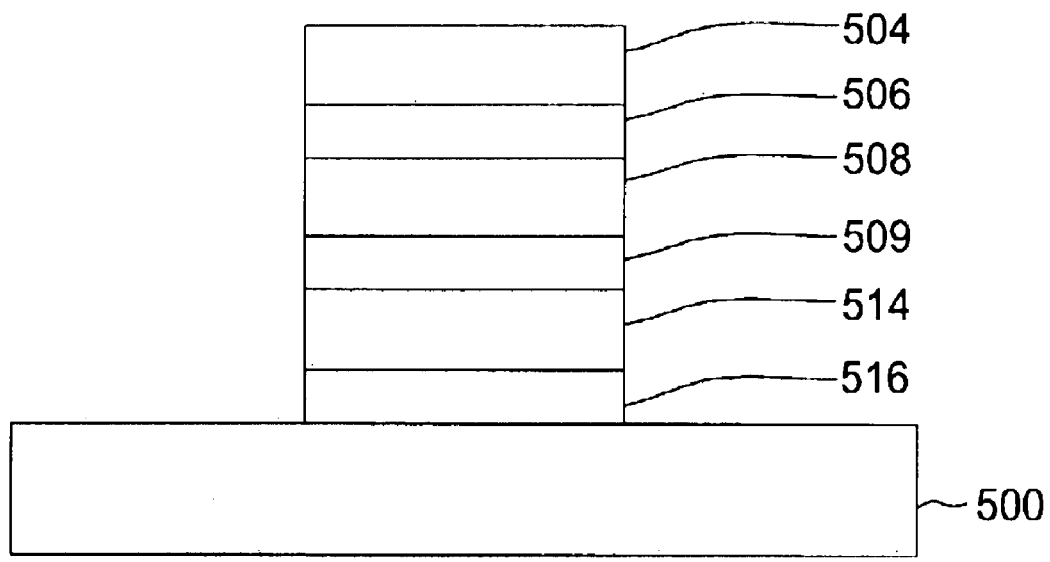

At step 424, the mask 522 and exposed portion (i.e., regions 526) of the barrier layer 516 are removed using, e.g., the buffered oxide etch (BOE) process that is described above in reference to step 132 of the method 100 (FIG. 5G). At step 426, the method 400 ends.

Figure 3:
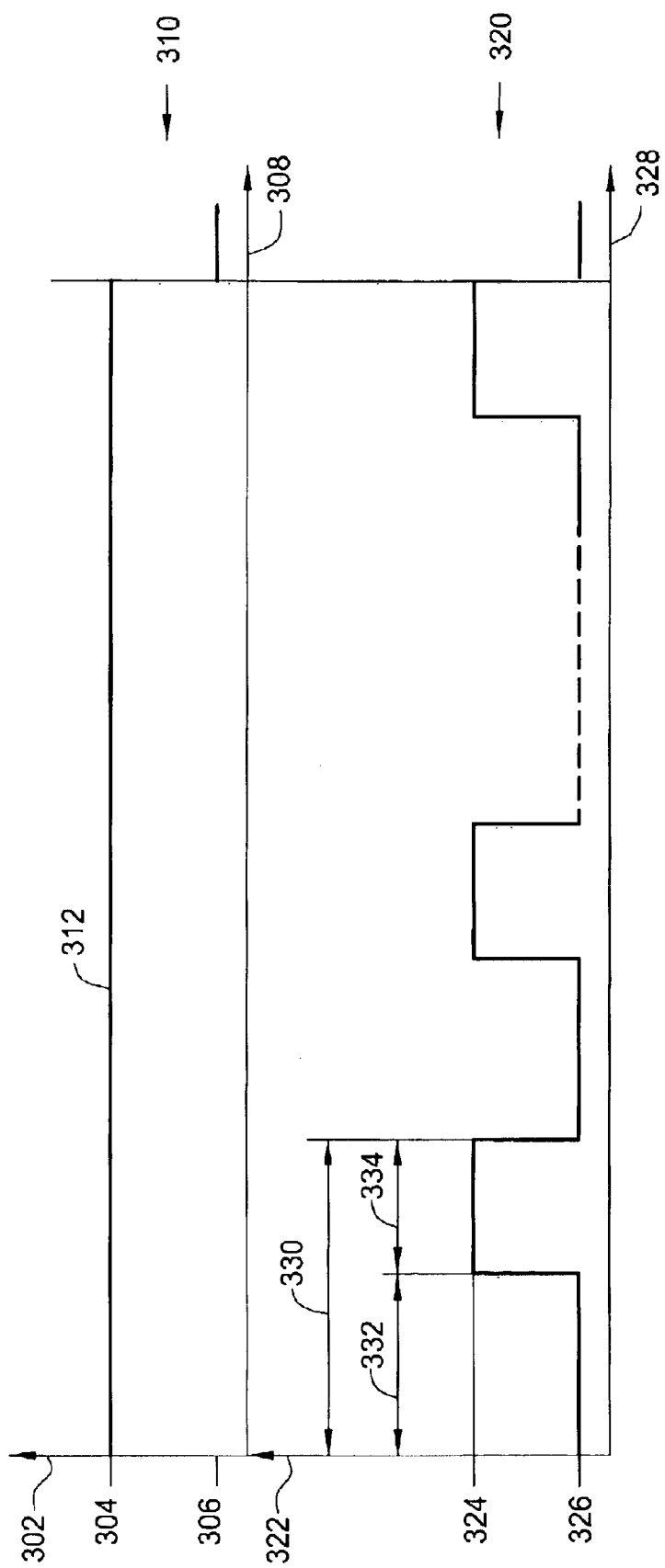
FIG. 3 is a timing diagram of a substrate bias power during the etch process in accordance with one embodiment of the present invention.

FIG. 3 is an exemplary timing diagram of the PSBT process of the present invention. FIG. 3 depicts a sequence of cycles 330 wherein each cycle 330 comprises a period 332 within which an etch process is performed with no substrate bias, and a period 334 within which the etch process is performed with the substrate bias. Together, a plurality of cycles 330 comprises a PSBT process 312. A first graph 310 depicts a status (y-axis 302) of the PSBT process, where the PSBT process is in ON (304) and OFF (306) states versus time (x-axis 308). Correspondingly, a second graph 320 (below) depicts a status (y-axis 322) of the substrate bias, where substrate bias is in ON (324) and OFF (326) states versus time (x-axis 328).

During the time interval 332 of the cycle 330 where the substrate bias is inactive, the etch process performs plasma enhanced chemical etching (e.g., the free magnetic layer 206 (step 108), or magnetic stack 210 (step 120), or ferroelectric layer 506 (step 410)). Similarly, during the time interval 334 of the cycle 330 where the substrate bias is active, the PSBT process performs simultaneous plasma enhanced chemical etching and physical etching (e.g., of the free magnetic layer 206 (step 108), or magnetic stack 210 (step 120), or ferroelectric layer 506 (step 412)). In FIG. 3, the PSBT process 312 begins with the period 332 and ends with the period 334. Alternatively, the PSBT process 312 may begin with the period 334 and end with the period 332 and/or comprise one or more additional etch periods 332 or 334 at any time during execution of the PSBT process. One skilled in the art will understand that the time required, in each cycle 330, to switch between etching without substrate bias and with the substrate bias is not shown, as well as that the duration of the periods 332 and 334 may vary during the PSBT process 312 due to factors, such as layer thickness, layer composition, and the like.

In further embodiments, the PSBT process may also be used to etch other conductive materials, such as metals, alloys, metal-comprising compounds, and the like that leave conductive post-etch residues. For example, the PSBT process may be used to etch the top and bottom electrodes 204 and 216 of the MRAM film stack 202, as well as the top and bottom electrodes 502 and 516 of the FeRAM film stack 502. In such embodiments, the PSBT process reduces or eliminates formation of the post-etch residue formed after etching the respective layers, as well as reduces plasma charge-up damage, as discussed above in reference to the methods 100 and 400.

Figure 6:
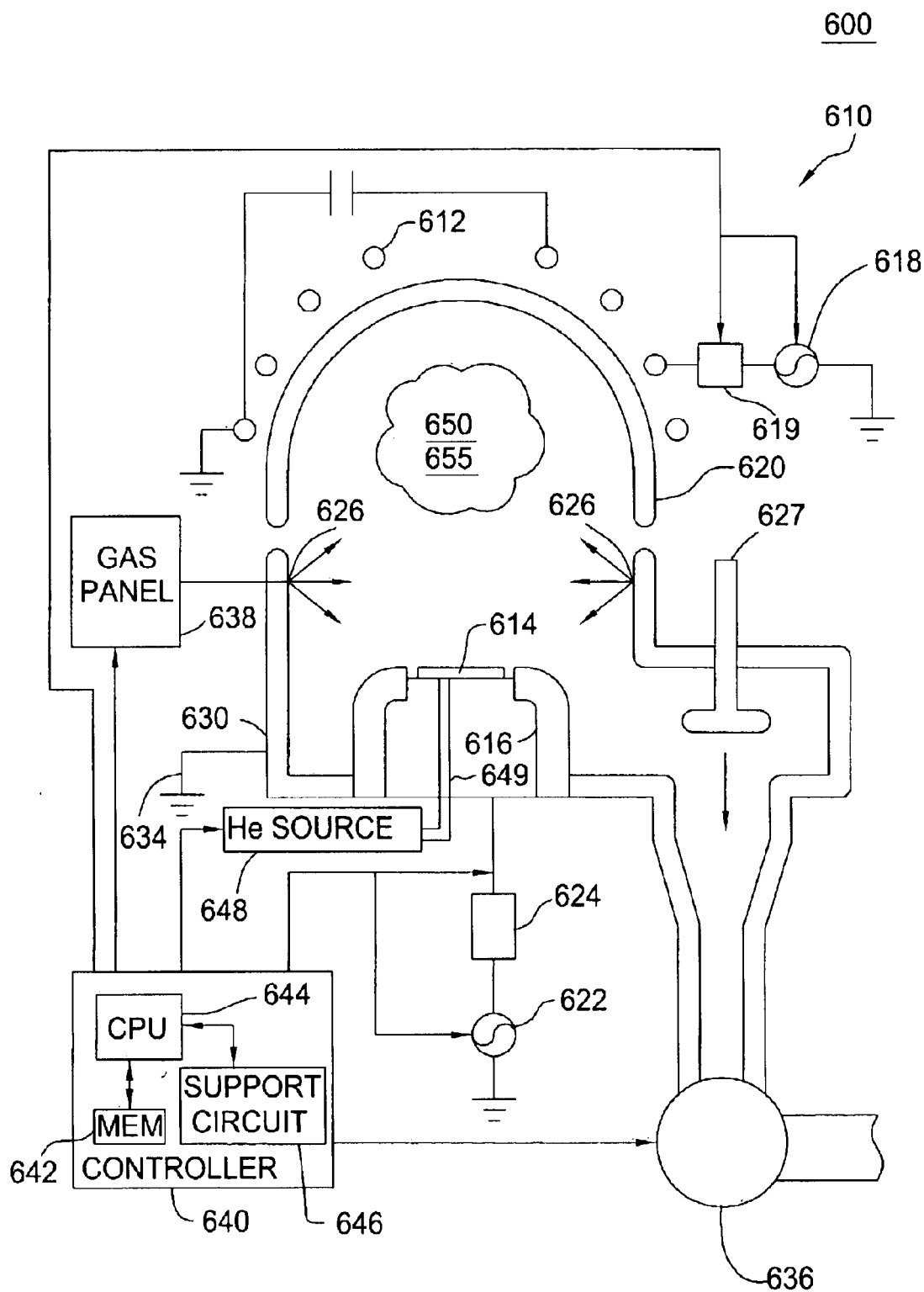
FIG. 6 depicts a schematic diagram of an exemplary plasma etch processing apparatus of the kind used in performing portions of the method of FIG. 1.

FIG. 6 depicts a schematic diagram of a DPS etch reactor 600 that may be used to practice portions of the inventive method 100. The reactor 600 comprises a process chamber 610 having a wafer support pedestal 616 within a conductive body (wall) 630, and a controller 640.

The support pedestal (cathode) 616 is coupled, through a first matching network 624, to a biasing power source 622. The biasing source 622 generally is a source of up to 500 W at a frequency of approximately 13.56 MHz that is capable of producing either continuous or pulsed power. In other embodiments, the source 622 may be a DC or pulsed DC source. The chamber 610 is supplied with a dome-shaped dielectric ceiling 620. Other modifications of the chamber 610 may have other types of ceilings, e.g., a substantially flat ceiling. Above the ceiling 620 is disposed an inductive coil antenna 612. The antenna 612 is coupled, through a second matching network 619, to a plasma power source 618. The plasma source 618 typically is capable of producing up to 3000 W at a tunable frequency in a range from 50 kHz to 13.56 MHz. Typically, the wall 630 is coupled to an electrical ground 634.

A controller 640 comprises a central processing unit (CPU) 644, a memory 642, and support circuits 646 for the CPU 644 and facilitates control of the components of the DPS etch process chamber 610 and, as such, of the etch process, as discussed below in further detail.

In operation, a semiconductor wafer 614 is placed on the pedestal 616 and process gases are supplied from a gas panel 638 through entry ports 626 and form a gaseous mixture 650. The gaseous mixture 650 is ignited into a plasma 655 in the chamber 610 by applying power from the plasma and bias sources 618 and 622 to the antenna 612 and the cathode 616, respectively. The pressure within the interior of the chamber 610 is controlled using a throttle valve 627 and a vacuum pump 636. The temperature of the chamber wall 630 is controlled using liquid-containing conduits (not shown) that run through the wall 630.

The temperature of the wafer 614 is controlled by stabilizing a temperature of the support pedestal 616. In one embodiment, the helium gas from a gas source 648 is provided via a gas conduit 649 to channels formed by the back of the wafer 614 and grooves (not shown) in the pedestal surface. The helium gas is used to facilitate heat transfer between the pedestal 616 and the wafer 614. During the processing, the pedestal 616 may be heated by a resistive heater (not shown) within the pedestal to a steady state temperature and then the helium gas facilitates uniform heating of the wafer 614. Using such thermal control, the wafer 614 is maintained at a temperature of between 0 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the process chamber 610 as described above, the controller 640 may be one of any form of general-purpose computer processor that can be used in an industrial setting for controlling various chambers and sub-processors. The memory, or computer-readable medium, 642 of the CPU 644 may be one or more of readily available memory such as random access memory (RAM), read only memory (ROM), floppy disk, hard disk, or any other form of digital storage, local or remote. The support circuits 646 are coupled to the CPU 644 for supporting the processor in a conventional manner. These circuits include cache, power supplies, clock circuits, input/output circuitry and subsystems, and the like. The inventive method is generally stored in the memory 642 as software routine. The software routine may also be stored and/or executed by a second CPU (not shown) that is remotely located from the hardware being controlled by the CPU 644.

The invention may be practiced in other semiconductor systems wherein the processing parameters may be adjusted to achieve acceptable characteristics by those skilled in the arts by utilizing the teachings disclosed herein without departing from the spirit of the invention.

Although the forgoing discussion referred to fabricating of the MRAM and FeRAM devices, fabricating of the other devices used in the semiconductor integrated circuits can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of etching a layer of magnetic or ferroelectric material on a semiconductor substrate, comprising:

plasma etching the layer by applying a plurality of etching cycles to the substrate, where each cycle comprises a first period of etching without substrate bias and a second period of etching with substrate bias to remove residue that results from the first period.

2. The method of claim 1 wherein:
the first period has a duration between 0.2 and 8 msec;
the second period has a duration between 0.2 and 8 msec; and
a duty cycle ratio for the second period is about 20 to 80% of a duration of the processing cycle.

3. The method of claim 1 wherein the layer comprises at least one of CoFe and NiFe.

4. The method of claim 3 further comprising during the first period:
providing $O_2$ and $Cl_2$ at a flow ratio $O_2:Cl_2$ in a range from 1:10 to 5:1; and maintaining a gas pressure in a range from about 1 to 20 mTorr.

5. The method of claim 3 further comprising during the second period:
providing $O_2$ and $Cl_2$ at a flow ratio $O_2:Cl_2$ in a range from 1:10 to 5:1;
applying the substrate bias at a power between about 50 and 500 W at about 50 kHz to 13.56 MHz; and
maintaining a gas pressure in a range from about 1 to 20 mTorr.

6. The method of claim 3 further comprising:
etching the layer without substrate bias for a duration of 1 msec providing $O_2$ at a rate of 40 sccm, $Cl_2$ at a rate of 20 sccm, and Ar at a rate of 20 sccm, applying 700 W to an inductively coupled antenna and 0 W of substrate bias power, and maintaining the substrate support pedestal at 40 degrees Celsius and a pressure in the reaction chamber at 5 mTorr; and
etching the layer with the substrate bias applied for a duration of 1 msec providing $O_2$ at a rate of 40 sccm, $Cl_2$ at a rate of 20 sccm, and Ar at a rate of 20 sccm, applying 700 W to an inductively coupled antenna and 100 W of substrate bias power, and maintaining the substrate support pedestal at 40 degrees Celsius end a pressure in the reaction chamber at 5 mTorr.

7. The method of claim 1 wherein the layer comprises at least one of CoFe, Ru, CoFe, PtMn or IrMn, NiFe, and NiFeCr.

8. The method of claim 7 further comprising during the first period:
providing $BCl_3$ and Ar at a flow ratio $BCl_3$:Ar in a range from 1:40 to 1:1; and maintaining a gas pressure in a range from about 5 to 20 mTorr.

9. The method of claim 7 further comprising during the second period:
providing $BCl_3$ and Ar at a flow ratio $BCl_3$:Ar in a range from 1:40 to 1:1;
applying the substrate bias at a power between about 50 and 500 W at about 50 kHz to 13.56 MHz; and
maintaining a gas pressure in a range from about 5 to 20 mTorr.

10. The method of claim 7 further comprising:
etching the layer without substrate bias for a duration of 1 msec providing $BCl_3$ at a rate of 20 sccm and Ar at a rate of 80 sccm, applying 700 W to an inductively coupled antenna and 0 W of substrate bias power, and maintaining the substrate support pedestal at 80 degrees Celsius and a pressure in the reaction chamber at 5 mTorr; and
etching the layer with the substrate bias applied for a duration of 1 msec providing $BCl_3$ at a rate of 20 sccm and Ar at a rate of 80 sccm, applying 700 W to an inductively coupled antenna and 100 W of substrate bias power, and maintaining the substrate support pedestal at 80 degrees Celsius end a pressure in the reaction chamber at 5 mTorr.

11. The method of claim 1 wherein the layer comprises at least one of lead zirconate titanate and barium strontium titanate.

12. The method of claim 11 further comprising during the first period:
providing $BCl_3$ and $CHF_3$ at a flow ratio $BCl_3$:$CHF_3$ in a range from 1:0 to 10:1; and
maintaining a gas pressure in a range from about 5 to 50 mTorr.

13. The method of claim 11 further comprising during the second period:
providing $BCl_3$ and $CHF_3$ at a flow ratio $BCl_3$:$CHF_3$ in a range from 1:0 to 10:1; applying the substrate bias at a power between about 50 and 500 W at about 50 kHz to 13.56 MHz; and
maintaining a gas pressure in a range from about 5 to 50 mTorr.

14. The method of claim 11 further comprising:
etching the layer without substrate bias for a duration of 1 msec providing $BCl_3$ at a rate of 40 sccm, $CHF_3$ at a rate of 5 sccm, and Ar at a rate of 90 sccm, applying 1500 W to an inductively coupled antenna and 0 W of substrate bias power, and maintaining the substrate support pedestal at 310 degrees Celsius and a pressure in the reaction chamber at 15 mTorr; and
etching the layer with the substrate bias applied for a duration of 1 msec providing $BCl_3$ at a rate of 40 sccm, $CHF_3$ at a rate of 5 sccm, and Ar at a rate of 90 sccm, applying 1500 W to an inductively coupled antenna and 300 W of substrate bias power, and maintaining the substrate support pedestal at 310 degrees Celsius and a pressure in the reaction chamber at 15 mTorr.

15. A method of fabricating a magneto-resistive random access memory (MRAM) device from a film stack comprising a top electrode layer, a free magnetic layer, a tunnel layer, a magnetic film stack, a bottom electrode layer, and a barrier layer that are formed on a semiconductor substrate, comprising:
(a) forming a patterned mask on the film stack to define the device;
(b) etching the top electrode layer;
(c) plasma etching the free magnetic layer by applying a plurality of etching cycles to the substrate, where each etching cycle comprises a first period of etching without substrate bias and a second period of etching with substrate bias;
(d) plasma etching the magnetic film stack by applying a plurality of etching cycles to the substrate, where each etching cycle comprises a third period of etching without substrate bias and a fourth period of etching with substrate bias; and
(e) etching the bottom electrode layer.

16. The method of claim 15 wherein:
the top electrode comprises at least one of Ta and TaN;
the free magnetic layer comprises at least one of NiFe and CoFe; the tunnel layer comprises $Al_2O_3$;
the magnetic film stack comprises at least one of NiFe, Ru, CoFe, PtMn, IrMn, NiFe, and NiFeCr;
the bottom electrode comprises at least one of Ta and TaN; and
the barrier layer comprises at least one of $SiO_2$ and $Si_3N_4$.

17. The method of claim 15 wherein the steps (c) and (d) further comprise:

the first and third periods have a duration between 0.09 and 9 msec;

the second and fourth periods have a duration between 0.01 and 1 msec; and a duty cycle ratio for the second and fourth periods are about 20 to 80% of a duration of the processing cycle.

18. The method of claim 16 wherein the step (c) during the first period of etching the free magnetic layer further comprises:

providing $O_2$ and $Cl_2$ at a flow ratio $O_2:Cl_2$ in a range from 1:10 to 1:1; and maintaining a gas pressure in a range from about 5 to 50 mTorr.

19. The method of claim 16 wherein the step (c) during the second period of etching the free magnetic layer further comprises:

providing $O_2$ and $Cl_2$ at a flow ratio $O_2:Cl_2$ in a range from 1:10 to 1:1;

applying the substrate bias power between about 50 and 500 W at about 50 kHz to 13.56 MHz; and maintaining a gas pressure in a range from about 5 to 50 mTorr.

20. The method of claim 16 wherein the step (c) further comprises:

etching the free magnetic layer without substrate bias for a duration of 1 msec providing $O_2$ at a rate of 40 sccm, $Cl_2$ at a rate of 20 sccm, and Ar at a rate of 20 sccm, applying 700 W to an inductively coupled antenna and 0 W of substrate bias power, and maintaining the substrate support pedestal at 40 degrees Celsius and a pressure in the reaction chamber at 5 mTorr; and etching the free magnetic layer with the substrate bias applied for a duration of 1 msec providing $O_2$ at a rate of 40 sccm, $Cl_2$ at a rate of 20 sccm, and Ar at a rate of 20 sccm, applying 700 W to an inductively coupled antenna and 100 W of substrate bias power, and maintaining the substrate support pedestal at 40 degrees Celsius and a pressure in the reaction chamber at 5 mTorr.

21. The method of claim 16 wherein the step (d) during the third period of etching the magnetic film stack further comprises:

providing $BCl_3$ and Ar at a flow ratio $BCl_3:Ar$ in a range from 1:40 to 1:1; and maintaining a gas pressure in a range from about 5 to 20 mTorr.

22. The method of claim 16 wherein the step (d) during the fourth period of etching the magnetic film stack further comprises:

providing $BCl_3$ and Ar at a flow ratio $BCl_3:Ar$ in a range from 1:40 to 1:1;

applying the substrate bias at a power between about 50 and 500 W at about 50 kHz to 13.56 MHz; and maintaining a gas pressure in a range from about 5 to 50 mTorr.

23. The method of claim 16 wherein the step (d) further comprises:

etching the magnetic film stack without substrate bias for a duration of 1 msec providing $BCl_3$ at a rate of 20 sccm and Ar at a rate of 80 sccm, applying 700 W to an inductively coupled antenna and 0 W of substrate bias power, and maintaining the substrate support pedestal at 80 degrees Celsius and a pressure in the reaction chamber at 5 mTorr; and etching the magnetic film stack with the substrate bias applied for a duration of 1 msec providing $BCl_3$ at a rate of 20 sccm and Ar at a rate of 80 sccm, applying 700 W to an inductively coupled antenna and 100 W of substrate bias power, and maintaining the substrate support pedestal at 80 degrees Celsius and a pressure on the reaction chamber at 5 mTorr.

* * * * *

UNITED STATES PATENT AND TRADEMARK OFFICE
CERTIFICATE OF CORRECTION

PATENT NO. : 6,942,813 B2
DATED : September 13, 2005
INVENTOR(S) : Chentsau Ying et al.

It is certified that error appears in the above-identified patent and that said Letters Patent is hereby corrected as shown below:

Column 4,
Line 35, delete "m torr" and insert -- mTorr --.
Lines 39-40, delete "m Torr" and insert -- mTorr --.

Column 6,
Lines 3 and 7, delete "m torr" and insert -- mTorr --.

Column 7,
Lines 14 and 18, delete "m Torr" and insert -- mTorr --.

Column 13,
Line 37, delete "end" and insert -- and --.

Column 14,
Line 2, delete "end" and insert -- and --.

Column 16,
Line 37, delete "on" and insert -- in --.

Signed and Sealed this

Fourteenth Day of February, 2006

JON W. DUDAS
*Director of the United States Patent and Trademark Office*